(12) United States Patent
Bowen et al.

(10) Patent No.: US 6,385,267 B1
(45) Date of Patent: May 7, 2002

(54) SYSTEM AND METHOD FOR LOCKING DISPARATE VIDEO FORMATS

(75) Inventors: Andrew Bowen, San Jose; David L. Dignam, Belmont; Nathaniel D. Naegle, Pleasanton, all of CA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/218,042

(22) Filed: Dec. 22, 1998

(51) Int. Cl.$^7$ ................................................. H03D 2/24
(52) U.S. Cl. ..................... 375/376; 375/371; 375/375; 375/373
(58) Field of Search ................................. 375/376, 373, 375/375, 371, 326, 327; 370/516; 713/400, 500, 501, 503

(56) References Cited

U.S. PATENT DOCUMENTS

| | | | | |
|---|---|---|---|---|
| 5,297,165 A | * | 3/1994 | Ueda et al. | 375/230 |
| 5,463,627 A | * | 10/1995 | Matsuoka et al. | 370/350 |
| 5,740,205 A | * | 4/1998 | Baum et al. | 375/344 |
| 5,809,009 A | * | 9/1998 | Matsuoka et al. | 370/206 |

OTHER PUBLICATIONS

Edwards, G., "I Need to Generate a Square Wave, So Can't I Just Use the MSB of the NCO Output?", Stanford Telecom Application Note 111, Jun. 1991.

Gorbics, M.S., et al., "A High Resolution Multihit Time–To–Digital Converter Integrated Circuit", LeCroy Corporation, Copyright Nov. 1996.

Zavrel Jr., Robert J., "Alias and Spurious Responses in DDS Systems", Stanford Telecom Application Note, 102, Mar. 1990.

"ISC 1522: User–Programmable Video Clock Generator/Line–Locked Clock Regenerator", Integrated Circuit Systems, Inc., May 6, 1997.

"ISC 1527: Advanced Information: Low Cost Programmable Line–Locked Clock Regenerator", Integrated Circuit Systems, Inc., Jul. 1, 1997.

Maneatis, John G., "Precise Delay Generation Using Coupled Oscillators", A Dissertation Submitted to the Department of Electrical Engineering and the Committee on Graduate Studies of Stanford University in Partial Fulfillment of the Requirements for the Degree of Doctor of Philosophy, Jun. 1994.

\* cited by examiner

*Primary Examiner*—Mohammad H. Ghayour
(74) *Attorney, Agent, or Firm*—Woodcock Washburn LLP

(57) ABSTRACT

A system and method for the phase alignment of signals of arbitrary relative frequency are described. A phase difference detector detects a phase difference between a first signal pulse and a corresponding second signal pulse. A phase comparator compares this detected phase difference to a calculated expected phase difference, to produce an error signal proportional to the difference. The clock generator adjusts the frequency of one of the signals by an amount based on the error signal, in order to phase align the first signal to the second signal. In a preferred embodiment, the first and second signals are video signals with a common frame rate and different line rates.

20 Claims, 7 Drawing Sheets

SYSTEM AND METHOD FOR LOCKING DISPARATE VIDEO FORMATS

BACKGROUND OF THE INVENTION

1. Field of the Invention

The present invention generally relates to the phase locking of signals, and more particularly relates to the phase alignment of video signals of arbitrary relative frequency.

2. Related Art

The phase locking of one signal to another signal is required in many areas of electrical design. Typically, such signal synchronization is accomplished through the use of phase lock loop technology, where the frequency of one signal is periodically adjusted to remain synchronized to a reference frequency. In video applications, it may be desirable to synchronize video from two different sources. For example, one may wish to align two video signals of HDTV (High Definition Television) format, with frame-by-frame, line-by-line, or even pixel-by-pixel synchronization. This may be useful for viewing images in a head-mounted display, with the separate sources respectively providing the left eye and right eye video. To suitably align the two separately sourced video signals, one of them must be monitored and periodically adjusted to maintain synchronization with the other.

In video applications, there are specific signal format considerations to take into account when determining how to synchronize signals. A pixel clock is commonly used to clock out pixel-by-pixel video information. The pixel clock is usually not transmitted with the video. Instead, pulses are incorporated into the video signal indicating the start of each horizontal scan line. This pulse is called Hsync (horizontal sync). The period of this horizontal sync pulse is divided by some integer to recover the pixel clock. A number of different video formats exist, including NTSC, which has 525 horizontal lines per vertical frame, and HDTV, which has 1,250 lines per frame. These video formats have a line ratio of 50:21. To synchronize these formats using traditional techniques, the HDTV clock would be adjusted at best every 50 lines (or 21 lines of the NTSC signal).

When synchronizing local video to video from external sources, phase locking techniques are frequently used. The external Hsync signal is typically separated from the composite video signal, and compared with the Hsync signal from the local video timing generator. The difference in arrival time of these two Hsync pulses is proportional to the phase error, and the sign of the difference is an indication of the lead/lag relationship between local and external Hsync signals. This error value is used to increase or retard the frequency of the local pixel clock generator until the local video timing generator is locked to external video with zero phase error. This means that corresponding pixels in local and external video scan lines match in time. Once horizontal lock is achieved, vertical lock is achieved by simply resetting the vertical line counter of the local video timing generator.

Although the above examples illustrate how video formats with the same frame rate can be synchronized, the frame rate restriction need not hold, and the signals need not be video signals. One such example is in the operation of a rate converter, a common product in the video industry. Film is recorded at 24 frames per second, while video is recorded at 30 frames per second. When transferring the film to video, the data conversion must be done with accurate clocking. Traditional synchronization techniques allow clock correction at every 5 frames of the film, which is equal to 6 frames of the video. It would be advantageous if clock correction could occur at a more frequent rate than the 6:5 field rate would allow. Similar problems arise when converting American NTSC (60 Hz) video to European PAL (50 Hz) video.

Other areas of non-video signal application include the tight phase control of clock signals. For example, a system may require asynchronous clocking, and also require that the two clocks be out of phase alignment. Traditional technology requires that the clocks first be synchronized, and the phase then be adjusted using other techniques. It would be advantageous if the clock could be synthesized with the correct phase by design. This could result in significantly simpler board designs.

Phase lock loop technology is commonly used to synchronize external and local Hsync signals. The synchronization of two video signals may also be referred to as Genlock. Genlock essentially relates to the phase locking of two signals with active feedback through the use of a phase-locked loop.

FIG. 1 illustrates a conventional phase lock loop 100, in which phase locking of two signals, an external signal 116 and a local signal 110, takes place. Phase lock loop 100 includes a phase difference detector 102, a local clock filter 104, a clock generator 108, and a local signal generator 120.

Phase difference detector 102 determines the phase difference between local signal 110 and external signal 116. External signal 116 is received from an external signal source 106. The phase difference determined is represented by an actual phase difference signal 112. If the value of actual phase difference signal is equal to zero, local signal 110 is locked in phase with external signal 116. If the value of actual phase difference signal 112 is not equal to zero, local signal 110 is not locked in phase with external signal 116, and the frequency of local signal 110 needs to be corrected in order to affect the phase of local signal 110 relative to external signal 116.

Local clock filter 104 receives actual phase difference signal 112, and creates an adjustment signal 105 for clock generator 108. Local clock filter 104 is usually a low-pass filter that removes any jitter in the clocking adjustments, and allows for the smooth alignment of local signal 110 and external signal 116 without ringing.

Clock generator 108 receives adjustment signal 105 and external reference clock 122, and creates a local clock signal 118. Clock generator 108 is frequently a voltage controlled oscillator (NCO) or counter. In the case where clock generator 108 is a voltage controlled oscillator (VCO), adjustment signal 105 is a voltage level. External reference clock 122 is used to provide the center frequency for clock generator 108. This frequency, in conjunction with an m-over-n frequency multiply/divide internal to clock generator 108, sets the overall target frequency of local clock signal 118. This target frequency can be marginally increased or decreased by varying the value of adjustment signal 105.

Local clock signal 118 is then received by local signal generator 120, and used to create local signal 110. Local signal generator 120 can be either an external block of logic, or logic internal to phase lock loop 100. This block generally takes the form of a frequency divider used to create a signal of the same frequency as the external reference.

The approach of FIG. 1 suffers from limitations. Phase lock loop 100 can only synchronize signals of the same frequency. This creates problems when it is desired to synchronize video formats which have different line frequencies. For example, NTSC, with 525 total lines (including vertical blanking period), does not line up line-by-line with HDTV, which consists of 1,250 total lines. With the approach of FIG. 1, the signals may only be aligned once per vertical frame, on the occurrence of the vertical sync signal (Vsync), perhaps 30 or 60 times per second, or with external masking logic on the local and external reference, every 50 HDTV lines or 21 NTSC lines. The viewer may be able to detect visually that the signals are not tightly synchronized. There may be a large amount of signal drift of one signal in relation to the other in between Vsync, or sparse Hsync, signals. When a high degree of accuracy in matching is desired, synchronizing only once per frame may not be adequate.

These limitations arise due to difficulty in simply and accurately measuring an arbitrary phase. The most common type of phase detection uses a charge pump. A charge pump is essentially a capacitor that begins charging when one signal arrives, and is then sampled by the second signal. Providing an accurately varying bias to this type of logic is very difficult. Furthermore, because traditional genlocking clock chips are analog by design, they are very susceptible to noise in the power supply. This sensitivity to noise drives up the costs of board design by requiring strict voltage regulation and noise filtering near the clock synthesis chip. A digital clock chip is more robust. It would be advantageous to incorporate the genlocking features of an analog design in a digital clock chip.

Additionally, when dealing with a variety of video formats, it may be impractical to maintain a separate signal source for each format in the laboratory. For example, a laboratory environment may have an established NTSC "house sync" signal, to which the laboratory equipment is synchronized. A great deal of effort and expense may have been expended in establishing the signal for widespread laboratory use. If the laboratory now desires to also use HDTV equipment, it may need to establish a new HDTV house sync signal. It would be advantageous if instead of establishing a new HDTV house sync signal, the new HDTV equipment could be synchronized to the established NTSC house sync signal.

SUMMARY OF THE INVENTION

Briefly stated, the present invention is a system and method for the phase-alignment of signals of arbitrary relative frequency. The invention uses a ratiometric calculator to determine the expected phase difference between the two signals at any time. Knowing the expected phase difference at all times makes possible the phase alignment of the two signals.

The phase alignment loop includes a local phase detector, a ratiometric calculator, a phase comparator, a local clock filter, a clock generator, and a local signal generator. The local phase detector detects a phase difference between a first signal pulse and a corresponding second signal pulse. This phase difference may be non-zero. The phase comparator compares this phase difference to an expected phase difference, calculated by the ratiometric calculator, to produce an error signal proportional to the difference. The local clock filter filters the error signal. The clock generator has the ability to adjust the frequency of a local clock signal by an amount based on the filtered error signal, in order to produce a phase aligned local clock signal. The frequency of the phase aligned local clock signal is divided to produce a first signal which is in phase alignment with the second signal.

In a preferred embodiment of the invention, the phase alignment loop is used to align a synthesized clock signal, such that it has a specific phase relative to an external reference signal. The external reference signal is a video Hsync signal. This external Hsync signal will be synchronized with a local Hsync signal generated by logic from the synthesized clock signal. In video applications, Hsync signals are frequently used to synchronize formats. This phase alignment loop may be used to align signals of a variety of different video formats, including NTSC and HDTV, or virtually any signals of arbitrary relative phase and frequency.

The present invention is directed toward a system and method for phase aligning a first signal and a second signal, wherein the first and second signals have different frequencies. A local phase detector detects a phase difference between a first signal pulse and a corresponding second signal pulse. The local phase detector receives the first signal, which starts a first local counter counting, producing a ramp signal of a frequency equal to the frequency of the first signal, that is locked in phase with the first signal. A second signal pulse is then received. This second signal pulse samples the ramp signal, providing a value which corresponds to the phase difference between the first signal pulse and the corresponding second signal pulse.

The phase comparator compares this detected phase difference to an expected phase difference, producing an error signal proportional to the difference. The phase comparator receives the expected phase difference from a ratiometric calculator. The ratiometric calculator includes a second local counter, which also produces a ramp signal. The value of this second ramp signal at any time corresponds to the expected phase difference between the first and second signals. The second signal pulse samples the second local counter, producing a value proportional to the expected phase difference at the current time. A phase comparator then compares this expected phase difference to the previously detected phase difference.

The clock generator then adjusts the frequency of the first signal by an amount based on this error signal, to phase align the first signal to the second signal. The clock generator receives an external reference clock signal. This external reference clock signal is used to create the first signal by dividing the frequency of the external reference clock signal by a delta value. The error signal is used to adjust the delta value to produce a corrected delta value. The clock generator then divides the frequency of the external reference clock signal by the corrected delta value to adjust the frequency of the first signal. This process phase aligns the first signal with the second signal.

In another aspect, instead of directly adjusting the first signal, the clock generator creates an adjusted local clock signal by dividing the frequency of the external reference clock signal by the corrected delta value. A divide by N counter then divides the frequency of the adjusted local clock signal by N, creating an adjusted first signal, wherein N is equal to the number of local clock signal pulses per first signal pulse.

In a further aspect of the present invention, a system and method for phase aligning a first video signal and a second video signal, wherein the first and second video signals have a common frame rate and different line rates, is provided. A detector detects a phase difference between a pulse of the first video signal and a corresponding pulse of the second video signal. A phase comparator compares the detected phase difference to an expected phase difference to produce an error signal proportional to the difference. A clock generator adjusts the frequency of one of the first and second video signals based on the error signal to phase align the first and second video signals.

In a preferred embodiment, the present invention uses the expected phase comparator to compute the expected phase difference at any time between the local and reference signals. It then compares this expected phase value to the actual phase difference signal received, to produce a phase error signal. In this manner, signals of arbitrary relative frequencies may be phase-aligned. This provides a number of advantages, such as:

(1) It allows accurate Genlock between dissimilar video formats, as long as their vertical rate (frame rate) is the same.

(2) In video applications, when synchronizing dissimilar video formats, the present invention allows synchronization to occur on receipt of every horizontal sync signal of the reference signal. This is an improvement over prior systems, where synchronization only occurred on receipt of the vertical or frame sync signal.

(3) It allows for the use of one "house sync" signal to which equipment of varying video formats can be uniformly synchronized.

BRIEF DESCRIPTION OF THE FIGURES

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the left-most digit(s) in the corresponding reference number.

DETAILED DESCRIPTION OF THE PREFERRED EMBODIMENTS

The present invention is directed to a method and system for locking disparate timing signals. Generally speaking, the invention is useful for phase aligning one signal to another signal of a different frequency. In a preferred embodiment, the present invention is useful for phase aligning a first video signal to a second video signal, where the signals have different line rates. For illustrative purposes, the invention is described herein with reference to this preferred embodiment. It should be understood, however, that the invention is not limited to this embodiment. The invention is not applicable not only to the phase locking of video signals, but also to any application involving the phase alignment of two signals of different frequencies.

STRUCTURE AND OPERATION OF THE INVENTION

Figure 1:
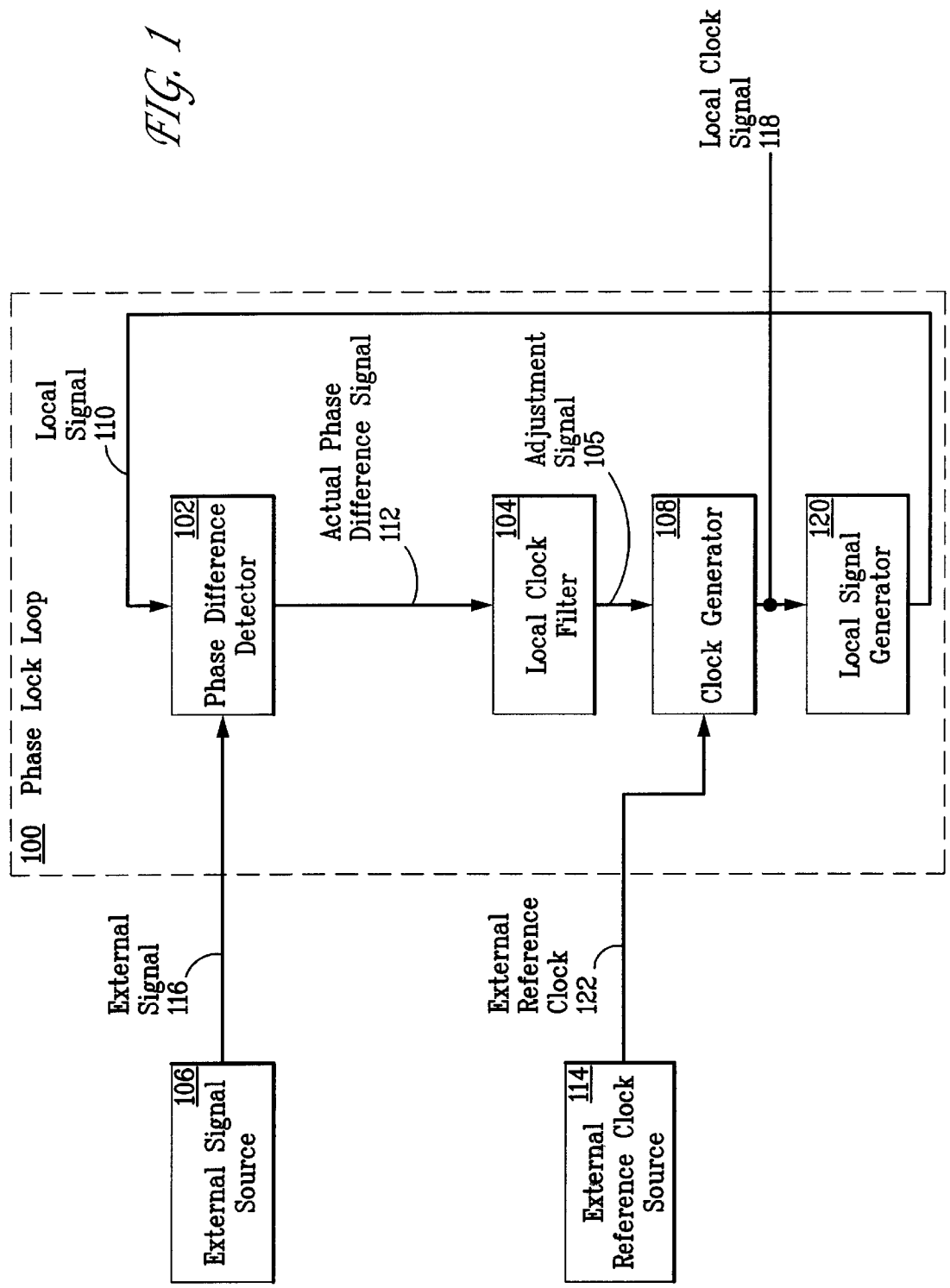
FIG. 1 is a block diagram of a conventional Phase Lock Loop.
Figure 2:
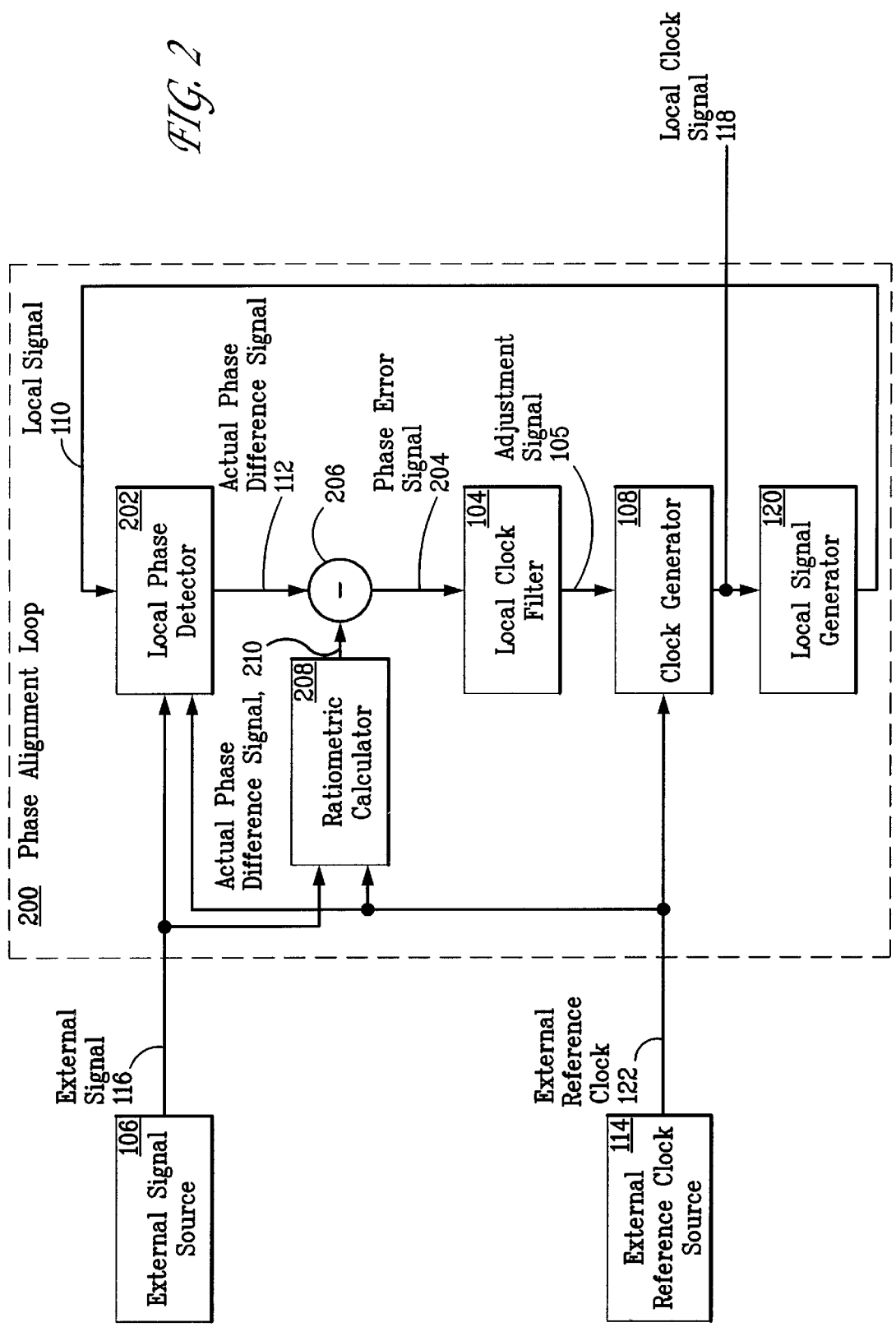
FIG. 2 is a block diagram of a Phase Alignment Loop according to the present invention.

FIG. 2 illustrates a phase alignment loop 200 according to a preferred embodiment of the present invention. The phase alignment loop 200 includes a local clock filter 104, a clock generator 108, a local signal generator 120, a local phase detector 202, a phase comparator 206, and a ratiometric calculator 208.

Local phase detector 202 is used to determine the phase difference between a received external signal 116 and local signal 110. Local phase detector 202 outputs this phase difference as actual phase difference signal 112. Local phase detector 202 receives external reference clock 122, which is provided by external reference clock source 114. The reference clock source 114 may be an external high frequency clock. More often, reference clock source 114 is an onchip part that receives a lower frequency clock signal, and multiplies this frequency using standard methods known in the art. Local phase detector 202 recalculates the phase of local signal 110 after the occurrence of each reference edge of external signal 116. Local phase detector 202 receives a pulse from external signal 116, and samples the phase value for local signal 110. The value sampled is the phase value generated by an NCO or counter in local phase detector 202. The NCO or counter is locked with the phase of local signal 110. This sampled value indicates the percentage of the period of local signal 110 that has elapsed since the last reference edge of local signal 110.

Simultaneous with the sampling of the phase of local signal 110, ratiometric calculator 208 generates an expected phase difference signal 210. Expected phase difference signal 210 is the sampled value of an NCO or counter in ratiometric calculator 208. This sampled value is equal to the expected value of the phase of local signal 110.

Phase comparator 206 calculates the difference between expected phase difference signal 210 and actual phase difference signal 112, and produces the phase error signal 204.

Local clock filter 104 receives phase error signal 204, and outputs adjustment signal 105. Local clock filter 104 performs a similar function as in a conventional phase lock loop, acting primarily as a low-pass filter.

Clock generator 108 receives adjustment signal 105 and external reference clock 122, and creates local clock signal 118. In a preferred embodiment, clock generator 108 generates local clock signal 118 using an NCO and digital frequency synthesis techniques. Refer to Stanford Telecom Application Note 102: "Alias and Spurious Responses in DDS Systems", Robert J. Zavrel Jr., March 1990, for general issues on generating a clock in a DDS (Direct Digital Synthesis) system, which is incorporated herein by reference. Refer to Stanford Telecom Application Note 111: "I Need to Generate a Square Wave, So Can't I Just Use the MSB of the NCO Output?", G. Edwards; June 1991, for more information on generating a lower frequency clock from a higher frequency clock, which is incorporated herein by reference. As such, the filters of local clock filter 104 are preferably digital discrete finite impulse response (FIR) filters. Adjustment signal 105 is used by clock generator 108 to alter the rate at which it synthesizes local clock signal 118. By extension, this alteration affects the timing of the next edge of local signal 110, and hence, the phase generation of local signal 110 in local phase detector 202. This adjustment of local signal 110 has the tendency of aligning the phase of local signal 110 with that of external signal 116, as desired.

Components of phase alignment loop 200 of the present invention are described further below in their preferred embodiments.

LOCAL PHASE DETECTOR

Figure 3:
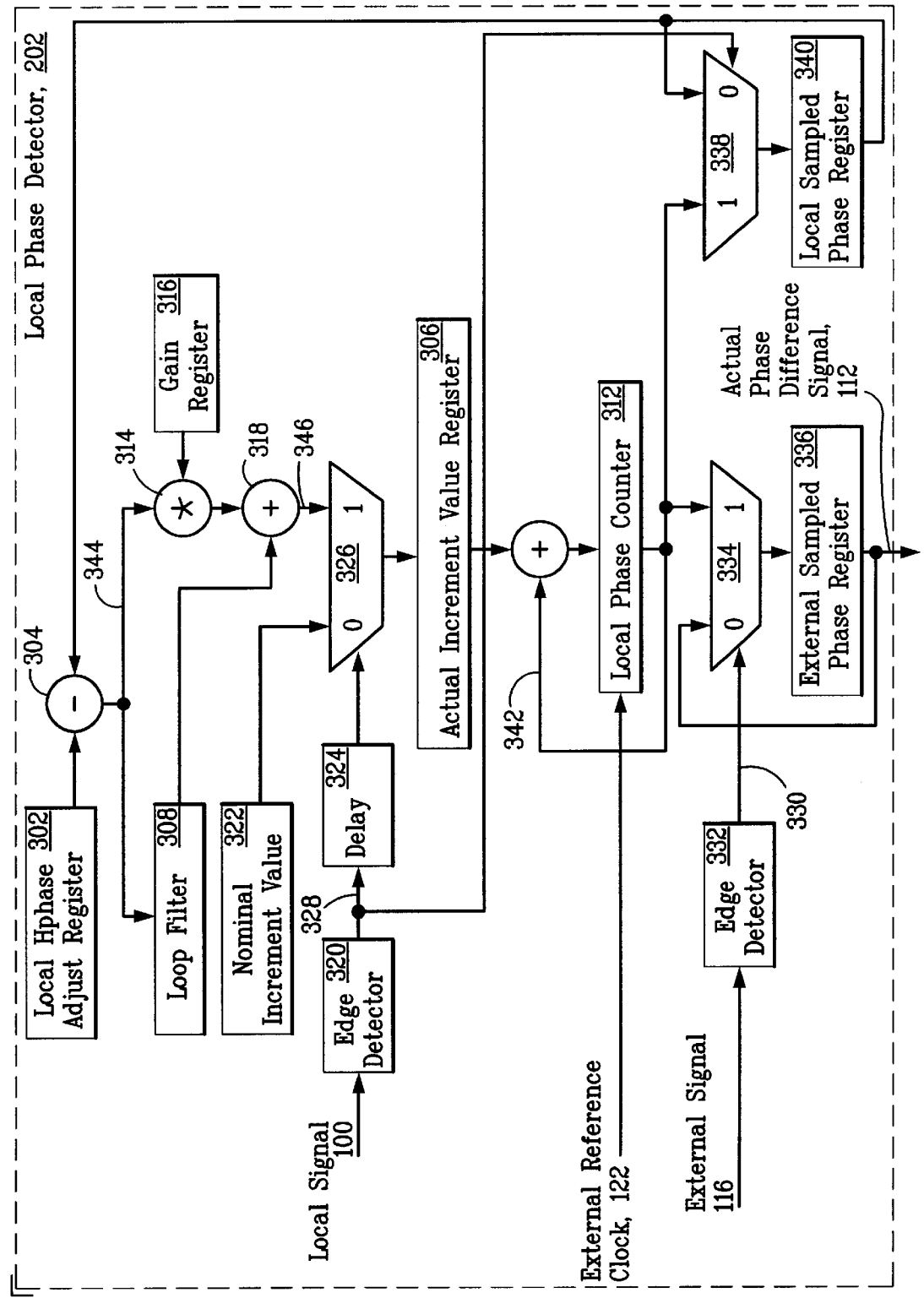
FIG. 3 is a block diagram of a Local Phase Detector according to a preferred embodiment of the present invention.

As shown in FIG. 3, local phase detector 202 includes a local hphase register 302, a comparator 304, an actual increment value register 306, a loop filter 308, a local phase adder 310, a local phase counter 312, a multiplier 314, a gain register 316, an adder 318, an edge detector 320, a nominal increment value 322, a delay 324, a multiplexor 326, an edge detector 332, a multiplexor 334, an external sampled phase register 336, a multiplexor 338, and a local sampled phase register 340. Local phase detector 202 receives local signal 110, external signal 116, and external reference clock 122. In a preferred embodiment, local signal 110 is a local hsync signal, and external signal 116 is an external hsync signal. The local and external hsync signals have the same frame rate, but different line rates.

Local phase detector 202 essentially operates as a phase lock loop, locked to the phase of local signal 110. Local phase detector 202 adjusts the frequency at which it ramps to match that of local signal 110, whose frequency may be changing to synchronize with external signal 116. External signal 116 samples the value of the ramp generator of local phase detector 202. Local phase detector 202 provides as output the sampled phase of local signal 110, in actual phase difference signal 112. Other methods or systems for implementing local phase detector 202 are also within the scope of the invention.

Local phase adder 310 and local phase counter 312 operate as a counter or NCO to produce local phase 342. Loop phase adder 310 adds the value from actual increment value register 306 and the prior output from loop phase counter 312. This sum is clocked into local phase counter 312 every time a pulse is received on external reference clock 122. The resulting output of local phase counter 312 is local phase 342. Essentially, local phase 342 is a multi-bit representation of the phase of local signal 110. For example, when the phase of local signal 110 is zero, meaning a pulse on local signal 110 has just arrived, local phase 342 will equal a binary zero. When the phase of local signal 110 has shifted by one clock cycle of external reference clock 122, local phase 342 will increment by one step. In this manner, the phase of local signal 110 is computed, and is represented in local phase 342 as a step-wise ramp waveform.

Local phase detector 202 must constantly monitor and adjust local phase 342 to stay in lock with local signal 110. Edge detector 320 detects an edge on local signal 110 and outputs local active edge signal 328. Through multiplexor 338 and edge detector 320, local signal 110 samples the value of local phase 342, storing this value in local sampled phase register 340. This value is then compared against the value stored in local hphase register 302 by comparator 304. The value stored in local hphase register 302 represents a desired phase offset between local signal 110 and external signal 116. Local hphase register 302 contains a non-zero value if it is desired to offset the phase of local signal 110 from that of external signal 116 by some amount. For example, if it is desired to offset the phase of local signal 110 from that of external signal 116 by 10% of the phase of local signal 110, local hphase register 302 would contain a value equal to 10% of the phase of local signal 110. Thus, when comparator 304 executes its subtraction, if a zero value results, this indicates that local signal 110 is at its proper phase offset. A non-zero value resulting from the subtraction by comparator 304 would indicate that local signal 110 is not at its proper phase offset. The result of the subtraction is phase offset value 344.

Loop filter 308, multiplier 314, gain register 316, and adder 318 are used to filter and scale phase offset value 344. Loop filter 308 filters phase offset value 344, providing memory as to the trend of adjustments made to the phase of local signal 110. Multiplier 314 multiplies phase offset value 344 by the value of gain register 316. This boosts or dampens the amplitude of the phase detected as needed by subsequent logic. Proper filter methods and gain settings for a particular application would be apparent to those skilled in the art. The filtered and multiplied portions of phase offset value 344 are combined by adder 318, producing a filtered phase increment signal 346.

Multiplexor 326 controls whether nominal increment value 322 or filtered phase increment signal 346 is used to increment the contents of local phase counter 312. Nominal increment value 322 provides the center point for increments of local phase counter 312. Filtered phase increment signal 346 provides a corrected increment value for local phase counter 312. A delayed version of local active edge signal 328 is used to select which increment signal is used. Delay 324 is used to align an update with filtered phase increment signal 346, which is delayed due to the time necessary to complete its calculation by comparator 304, multiplier 314, and adder 318. Multiplexor 326 outputs the selected increment signal value to actual increment value register 306. The value stored in actual increment value register 306 is used to increment local phase counter 312 on the occurrence of every pulse of external reference clock 122. When local signal 110 is in proper phase alignment with external signal 116, nominal increment value 322 is selected to increment local phase counter 312. When local signal 110 is not in proper phase alignment, filtered phase increment signal 346 is selected to increment local phase counter 312. This has the tendency to properly align the phase of local signal 110 with external signal 116.

For example, when local signal 110 and external signal 116 are properly phase aligned, nominal increment value 322 will be used to increment local phase counter 312. When an update is needed, however, filtered phase increment signal 346 will be used to increment local phase counter 312. Once the signals are again in phase alignment, the system will return to using nominal increment value 322 for increments until another update is required.

Multiplexor 334 receives local phase 342 and external active edge signal 330 as input, and outputs a value which is subsequently stored in external sampled phase register 336. The value of external sampled phase register 336 is output as actual phase difference signal 112. External active edge signal 330 is an active edge of external signal 116, output by edge detector 332. When a pulse arrives on external signal 116, multiplexor 334 outputs the value of local phase 342 into external sampled phase register 336. This value is output from local phase detector 202 as actual phase difference signal 112. Actual phase difference signal 112 represents the actual phase difference between external signal 116 and local signal 110.

RATIOMETRIC CALCULATOR

Figure 4:
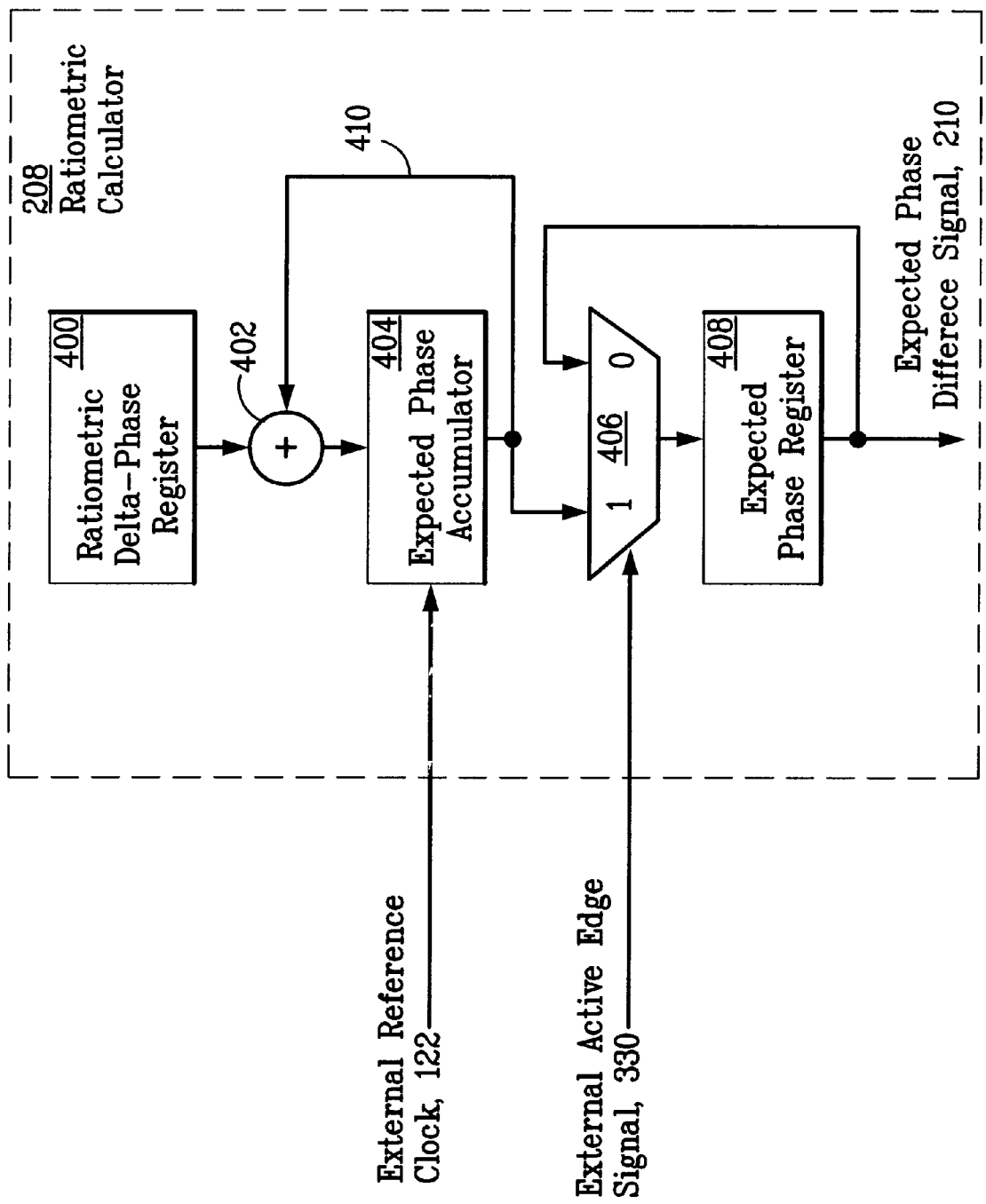
FIG. 4 is a block diagram of a Ratiometric Calculator according to a preferred embodiment of the present invention.

As shown in FIG. 4, ratiometric calculator 208 includes a ratiometric delta-phase register 400, a ratiometric adder 402, an expected phase accumulator 404, a multiplexor 406, and an expected phase register 408.

Ratiometric calculator 208 essentially operates as a counter or NCO. Other methods or systems for implementing ratiometric calculator 208 are also within the scope of the invention. On each pulse of external reference clock 122, ratiometric adder 402 adds the value programmed into the ratiometric delta-phase register 400 to the previous output of the expected phase accumulator 404. This causes the output of the expected phase accumulator 404 to appear as a step-wise ramp signal. The output ramp signal is expected phase 410. Expected phase 410 represents the expected phase difference between external signal 116 and local signal 110, at any time.

The value programmed into the ratiometric delta-phase register 400 is determined from the relative frequencies of external signal 116 and local signal 110. It is desired to program the ratiometric delta-phase register 400 with a value which will cause the ratiometric calculator 208 to ramp at a frequency such that the ramp value at any time represents the expected phase difference between external signal 116 and local signal 110. This is accomplished by programming register 400 with a value such that when a pulse of an external signal 116 arrives (i.e. the phase of external signal 116 is zero), the ramp value is equal to the expected phase difference.

Figure 5:
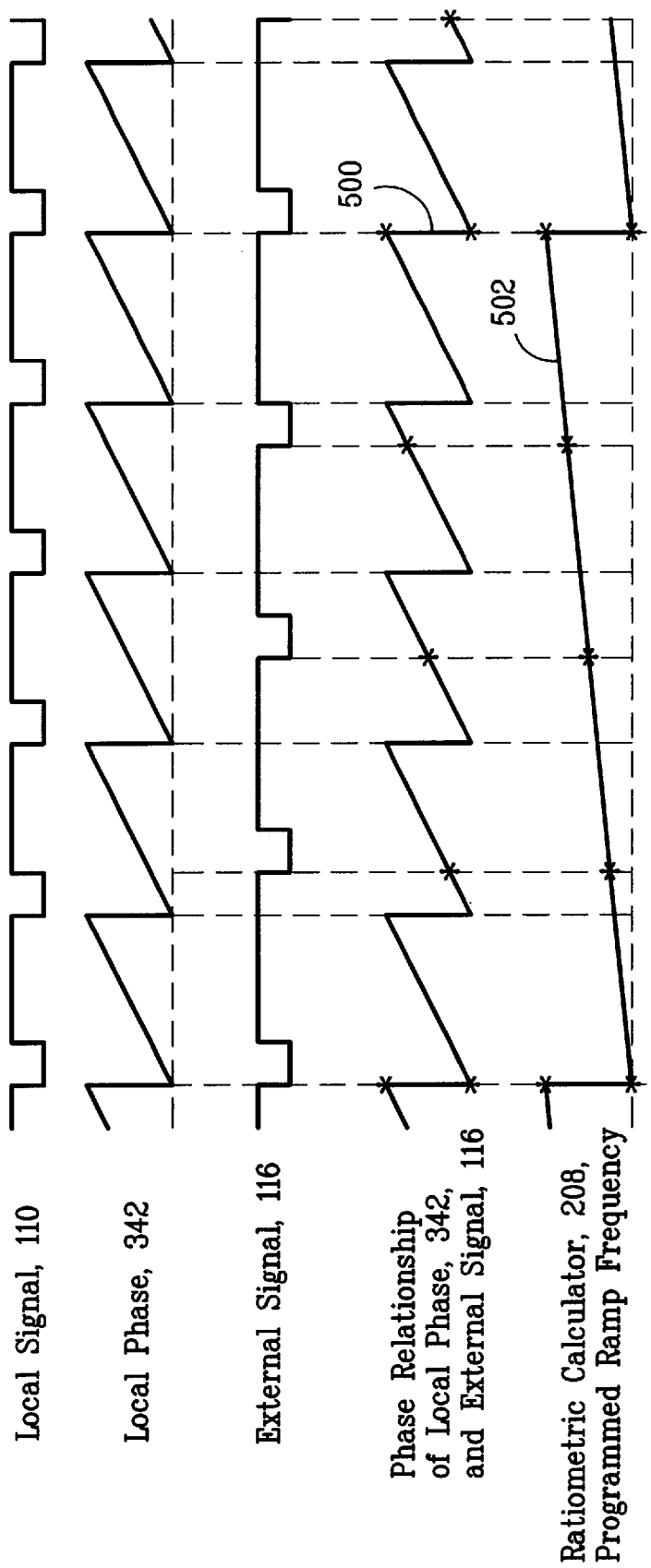
FIG. 5 is a group of signal waveforms, showing the expected phase relationship between phase aligned local and external signals.

Referring to FIG. 5, external signal 116 and local signal 110 have different line rates. Local phase detector 202 produces a ramp signal representing the phase of local signal 110, called local phase 342. Signal 500 represents the phase relationship of local phase 342 and external signal 116. As signal 500 shows, external signal 116 samples local phase 342 at progressively later portions of its phase. These sample points can be joined to form a ramp signal representative of the expected phase difference between local signal 110 and external signal 116. The frequency of such a waveform is an alias frequency of local signal 110 and external signal 116. In the example of FIG. 5, the ratiometric calculator 208 programmed frequency can be determined from the relationship of the period (TL) of local signal 110 to the period (TE) of external signal 116:

$$T_E = 1.25 T_L$$

or $$4 T_E = 5 T_L$$

Here, the relationship between the respective signal periods indicates that the ratiometric calculator 208 should be programmed to ramp at a period of four times that of external signal 116 (or five times that of local signal 110). This is represented graphically as signal 502. In this manner, the output of ratiometric calculator 208 will represent the expected phase difference between external signal 116 and local signal 110, at all times. After every four periods of external signal 116 or every five periods of local signal 110, the expected phase difference returns to zero. The ramp signal representing the expected phase difference is indicated as expected phase 410 in FIG. 4. Ratiometric delta-phase register 400 is programmed with a value such that expected phase 410 ramps at this desired period.

The arrival of an edge on external active edge signal 330 causes multiplexor 406 to provide the value of expected phase 410, storing the result in expected phase register 408. Expected phase register 408 outputs this stored value of expected phase 410 as expected phase difference signal 210. Expected phase difference signal 210 represents the expected phase difference between external signal 116 and local signal 110.

PHASE COMPARATOR

As shown in FIG. 2, phase comparator 206 accepts actual phase difference signal 112 and expected phase difference signal 210 as input, and outputs a phase error signal 204. Phase comparator 206 calculates the difference between expected phase difference signal 210 and actual phase difference signal 112. This phase difference is phase error signal 204, which is provided to local clock filter 104. Phase error signal 204 is proportional to the degree to which external signal 116 and local signal 110 are out of proper phase alignment.

LOCAL CLOCK FILTER

Local clock filter 104 receives phase error signal 204, and outputs adjustment signal 105. Local clock filter 104 performs a similar function as in a conventional phase lock loop. Local clock filter 104 is preferably a low-pass filter that removes any jitter in the clocking adjustments, and allows for the smooth alignment of local signal 110 and external signal 116 without ringing. The filters of local clock filter 104 are preferably digital discrete finite impulse response (FIR) filters.

CLOCK GENERATOR

Figure 6:
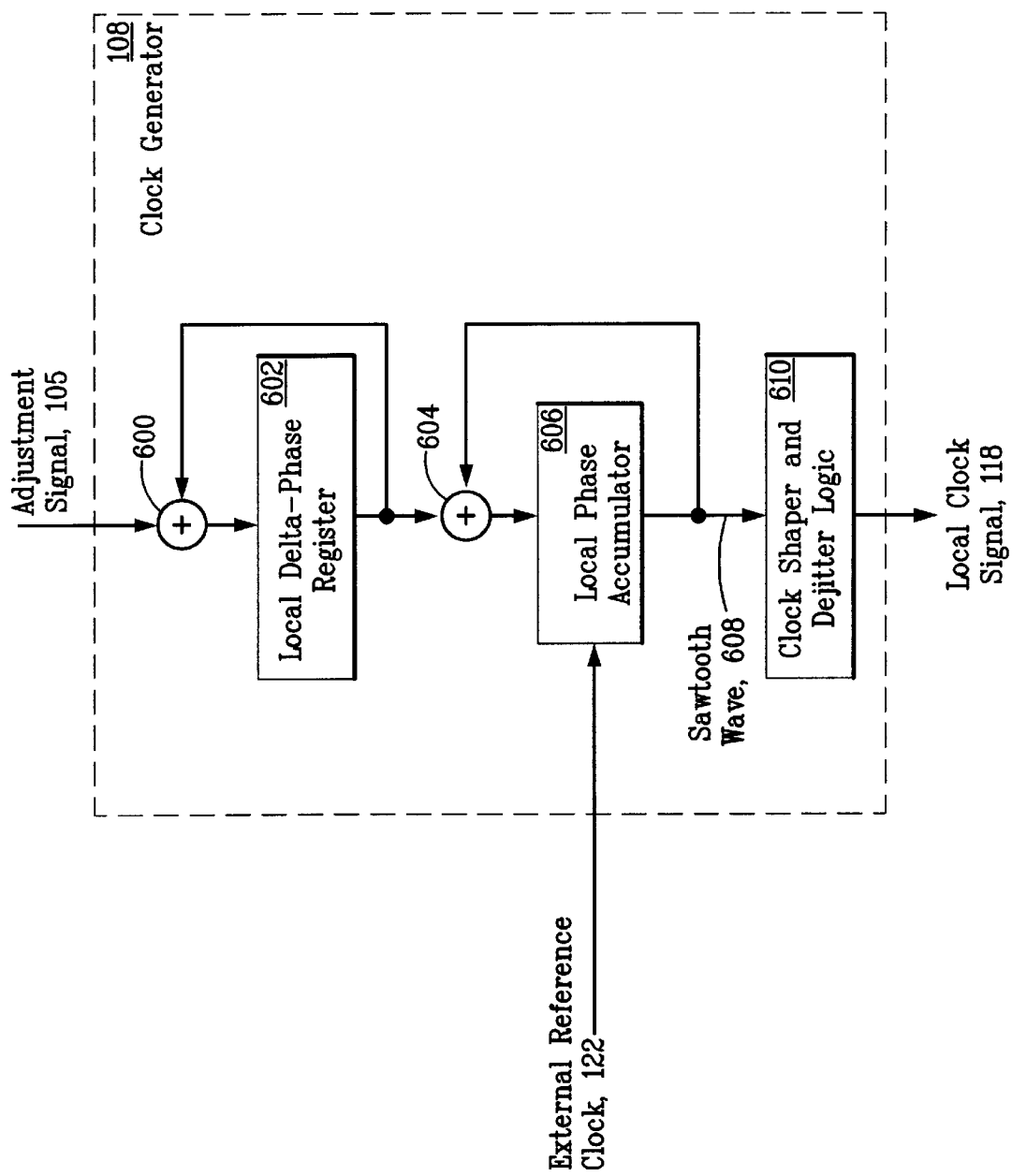
FIG. 6 is a block diagram of a Clock Generator according to a preferred embodiment of the present invention.

As shown in FIG. 6, clock generator 108 includes a local delta value adder 600, a local delta-phase register 602, a local phase adder 604, a local phase accumulator 606, and a clock shaper and dejitter logic 610. Clock generator 108 essentially operates as a counter or NCO. Other methods or systems for implementing clock generator 108 are within the scope of the invention. The contents of local phase accumulator 606 are increased every clock cycle of external reference clock 122 by the value of local delta-phase register 602. This causes the output of local phase accumulator 606 to increase in a step-wise ramp fashion. The output of local phase accumulator 606 is sawtooth wave 608. Sawtooth wave 608 is set equal to the most significant bit (MSB) of the contents of local phase accumulator 606. In this manner, sawtooth wave 608 ramps at the frequency of external reference clock 122 divided by the value stored in local delta-phase register 602.

Sawtooth wave 608 passes through clock shaper and dejitter logic 610 to produce local clock signal 118. Clock shaper and dejitter logic 610 is used to convert sawtooth wave 608 into a square wave. It is well known to those skilled in the art how to convert a sawtooth wave into a square wave. The dejitter logic generally eliminates sub-period jitter. Various methods for eliminating jitter will be apparent to a person skilled in the art.

Adjustment signal 105 is used to adjust the value of local delta-phase register 602. If the value of adjustment signal 105 is zero, the value stored in local delta-phase register 602 is not altered, and the frequency of local clock signal 118 remains the same. If the value of adjustment signal 105 is non-zero, local delta value adder 600 adds this value to the previous value stored in local delta-phase register 602. In this situation, the frequency of local clock signal 118 is adjusted, to correct for the phase error, and a corrected local clock signal 118 is produced.

LOCAL SIGNAL GENERATOR

Referring back to FIG. 2, local signal generator 120 is used to divide the frequency of local clock signal 118 to create the lower frequency local signal 110. In a preferred embodiment, local signal generator 120 is a counter that increments on pulses of local clock signal 118. Local signal 110 may be logically tied to some combination of the output bits of the counter, depending on the value of frequency division desired. In video applications, this value may be equal to the number of pixels per horizontal line, or pulses of local clock signal 118 per pulse of local signal 110. Alternate ways for implementing local signal generator 120 will be apparent to a person skilled in the art and are also within the scope of the present invention.

In other implementations of the invention, where local clock signal 118 and local signal 110 are not both required, it may be desirable to have local signal 110 tied directly to local clock signal 118, thereby eliminating local signal generator 120. Additionally, local signal generator 120 may be retained, but configured such that the divisor is set equal to one. In this arrangement, local signal 110 would merely follow local clock signal 118.

EXTERNAL SIGNAL SOURCE

In the video environment, external signal source 106 will typically be some horizontal sync signal available in the laboratory to which it is desirable to align another video signal. This may include NTSC or HDTV horizontal sync signals, among other available video formats. It is to be understood, however, that external signal source 106 may be any frequency source to which another signal frequency may be suitably synchronized.

EXTERNAL REFERENCE CLOCK SOURCE

External reference clock source 114 generates external reference clock 122. External reference clock 122 is used to clock local phase detector 202, ratiometric calculator 208, and clock generator 108. External reference clock source 114 generates a typical clock signal for clocking electronic circuitry.

COMPLETE PHASE ALIGNMENT LOOP

Figure 7:
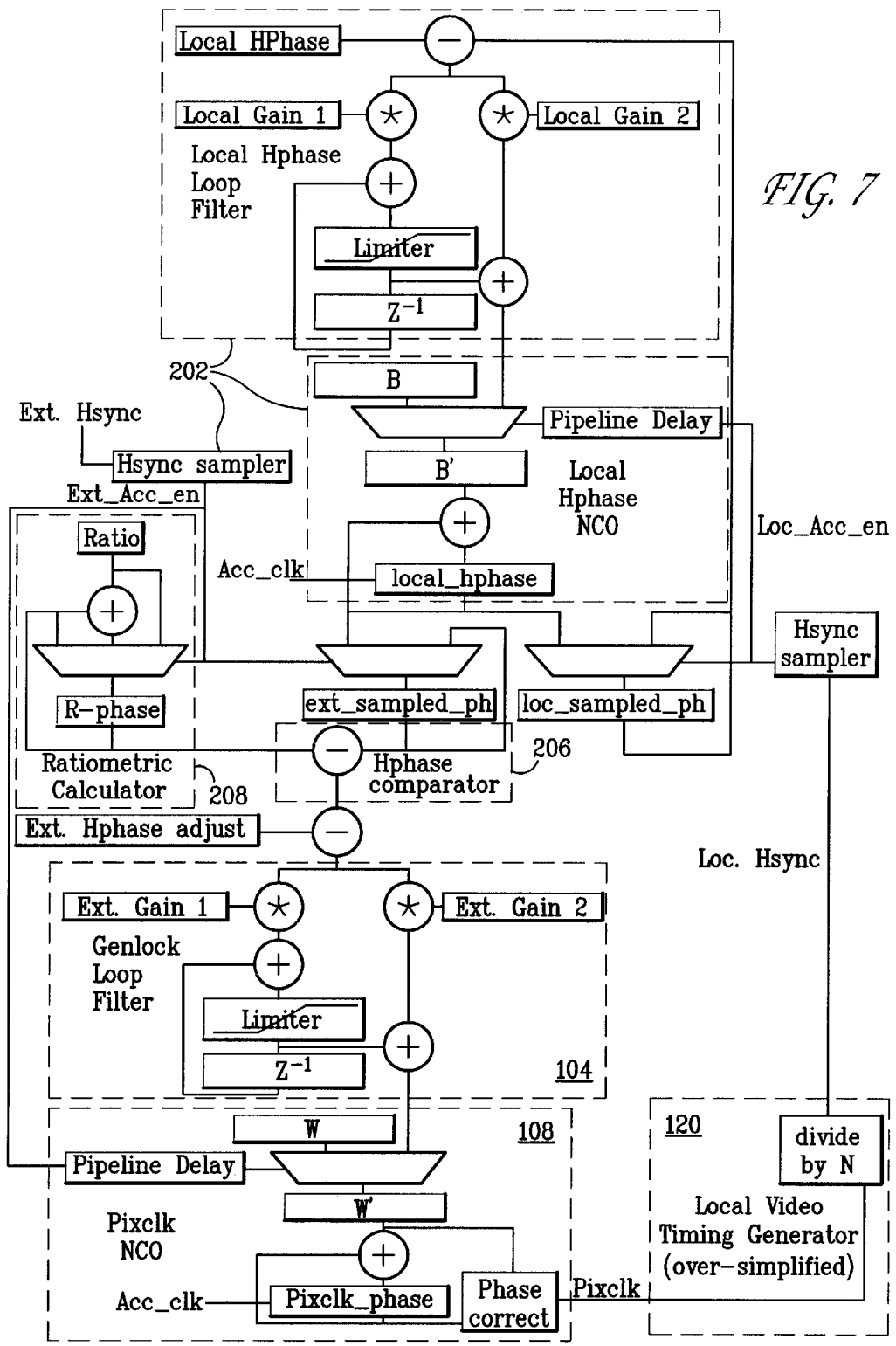
FIG. 7 is a block diagram of a Complete Phase Alignment Loop showing greater detail than FIG. 2.

FIG. 7 shows a detailed block diagram of a preferred embodiment of a complete phase alignment loop. The major blocks shown in FIG. 7 relating to local clock filter 104, clock generator 108, local signal generator 120, local phase detector 202, phase comparator 206, and ratiometric calculator 208 are indicated.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. For example, the preferred embodiment described herein demonstrates a system that updates the local signal at every external reference clock edge. In some applications this could allow updates to occur at inappropriate times. For instance, in a video application, an update in the midst of a horizontal line might be noticeable. An alternative embodiment could allow for deferring of updates to the clock generator, possibly through the use of update queues. In this manner, an update could be implemented upon occurrence of the next horizontal sync pulse, or any other opportune time. Such an alternative embodiment is within the bounds of the present invention. Thus, the breadth and scope of the present invention should not be limited by any of the above-described exemplary embodiments, but should be defined only in accordance with the following claims and their equivalents.

What is claimed is:

1. A method for phase aligning a first signal and a second signal, wherein the first and second signals have different frequencies, the method comprising the steps of:
   (a) detecting a phase difference between a pulse of the first signal and a corresponding pulse of the second signal;
   (b) comparing said detected phase difference to a calculated expected phase difference to produce an error signal proportional to the difference;
   (c) generating a local clock signal, wherein the frequency of said local clock signal is adjusted based on said error signal in order to phase adjust said local clock signal; and
   (d) generating one of said first or second signals, wherein the frequency of said generated one of said first or second signals is equal to the frequency of said local clock signal divided by N, wherein N is equal to the number of local clock signal pulses per pulse of said generated one of said first or second signals, to phase align said first and second signal.

2. The method of claim 1, wherein said detecting step comprises the steps of:
   starting a first counter counting upon receipt of said pulse of the first signal, wherein said first counter produces a first ramp signal of a frequency equal to the frequency of the first signal, and said first ramp signal is locked in phase with the first signal; and
   sampling said first ramp signal with said corresponding pulse of the second signal, wherein said sample of said first ramp signal represents said detected phase difference between the first and second signals.

3. The method of claim 2, wherein said comparing step comprises the steps of:
   receiving said calculated expected phase difference from a ratiometric calculator; and
   comparing said calculated expected phase difference to said detected phase difference to produce said error signal.

4. The method of claim 3, wherein said ratiometric calculator comprises a second counter that produces a second ramp signal whose value at any time corresponds to said calculated expected phase difference between the first and second signals, and wherein said receiving step comprises:
   sampling said second counter with said pulse of the second signal, said sample of said second counter representing said calculated expected phase difference.

5. The method of claim 4, wherein said local clock signal generating step comprises the steps of:
   receiving a reference clock signal;
   filtering said error signal to produce an adjustment signal;
   using said adjustment signal to adjust a delta value to produce a corrected delta value; and
   dividing the frequency of said reference clock signal by said corrected delta value to generate a frequency adjusted local clock signal.

6. A system for phase aligning a first signal and a second signal, wherein the first and second signals have different frequencies, comprising:
   means for detecting a phase difference between a pulse of the first signal and a corresponding pulse of the second signal;
   means for comparing said detected phase difference to a calculated expected phase difference to produce an error signal proportional to the difference;

means for generating a local clock signal, wherein the frequency of said local clock signal is adjusted based on said error signal in order to phase adjust said local clock signal; and means for generating one of said first or second signals, wherein the frequency of said generated one of said first or second signals is equal to the frequency of said local clock signal divided by N, wherein N is equal to the number of local clock signal pulses per pulse of said generated one of said first or second signals, to phase align said first and second signal.

7. The system of claim 6, wherein said detecting means comprises:

means for starting a first counter counting upon receipt of said pulse of the first signal, wherein said first counter produces a first ramp signal of a frequency equal to the frequency of the first signal, and said first ramp signal is locked in phase with the first signal; and means for sampling said first ramp signal with said corresponding pulse of the second signal, wherein said sample of said first ramp signal represents said detected phase difference between the first and second signals.

8. The system of claim 7, wherein said comparing means comprises:

means for receiving said calculated expected phase difference from a ratiometric calculator; and means for comparing said calculated expected phase difference to said detected phase difference to produce said error signal.

9. The system of claim 8, wherein said ratiometric calculator comprises a second counter that produces a second ramp signal whose value at any time corresponds to said calculated expected phase difference between the first and second signal, and wherein said receiving means comprises:

means for sampling said second counter with said pulse of the second signal, said sample of said second counter representing said calculated expected phase difference.

10. The system of claim 9, wherein said local clock signal generating means comprises:

means for receiving a reference clock signal;

means for filtering said error signal to produce an adjustment signal;

means for using said adjustment signal to adjust a delta value to produce a corrected delta value; and means for dividing the frequency of said reference clock signal by said corrected delta value to generate a frequency adjusted local clock signal.

11. A method for phase aligning a first video signal and a second video signal, wherein the first and second video signals have a common frame rate and different line rates, the method comprising the steps of:

(a) detecting a phase difference between a pulse of the first video signal and a corresponding pulse of the second video signal;

(b) comparing said detected phase difference to a calculated expected phase difference to produce an error signal proportional to the difference;

(c) generating a local clock signal, wherein the frequency of said local clock signal is adjusted based on said error signal in order to phase adjust said local clock signal; and (d) generating one of said first or second video signals, wherein the frequency of said generated one of said first or second video signals is equal to the frequency of said local clock signal divided by N, wherein N is equal to the number of local clock signal pulses per pulse of said generated one of said first or second video signals, to phase align said first and second video signal.

12. The method of claim 11, wherein said detecting step comprises the steps of:

starting a first counter counting upon receipt of said pulse of the first video signal, wherein said first counter produces a first ramp signal of a frequency equal to the line rate of the first video signal, and said first ramp signal is locked in phase with the first video signal; and sampling said first ramp signal with said corresponding pulse of the second video signal, wherein said sample of said first ramp signal represents said detected phase difference between the first and second video signals.

13. The method of claim 12, wherein said comparing step comprises the steps of:

receiving said calculated expected phase difference from a ratiometric calculator; and comparing said calculated expected phase difference to said detected phase difference to produce said error signal.

14. The method of claim 13, wherein said ratiometric calculator comprises a second counter that produces a second ramp signal whose value at any time corresponds to said calculated expected phase difference between the first and second video signals, and wherein said receiving step comprises:

sampling said second counter with said pulse of the second video signal, said sample of said second counter representing said calculated expected phase difference.

15. The method of claim 14, wherein said local clock signal generating step comprises the steps of:

receiving a reference clock signal;

filtering said error signal to produce an adjustment signal;

using said adjustment signal to adjust a delta value to produce a corrected delta value; and dividing the frequency of said reference clock signal by said corrected delta value to generate a line rate adjusted local clock signal.

16. A system for phase aligning a first video signal and a second video signal, wherein the first and second video signals have a common frame rate and different line rates, comprising:

means for detecting a phase difference between a pulse of the first video signal and a corresponding pulse of the second video signal;

means for comparing said detected phase difference to a calculated expected phase difference to produce an error signal proportional to the difference;

means for generating a local clock signal, wherein the frequency of said local clock signal is adjusted based on said error signal in order to phase adjust said local clock signal; and means for generating one of said first or second video signals, wherein the frequency of said generated one of said first or second video signals is equal to the frequency of said local clock signal divided by N, wherein N is equal to the number of local clock signal pulses per pulse of said generated one of said first or second video signals, to phase align said first and second video signal.

17. The system of claim 16, wherein said detecting means comprises:

means for starting a first counter counting upon receipt of said pulse of the first video signal, wherein said first counter produces a first ramp signal of a frequency equal to the line rate of the first video signal, and said first ramp signal is locked in phase with the first video signal; and means for sampling said first ramp signal with said corresponding pulse of the second video signal, wherein said sample of said first ramp signal represents said detected phase difference between the first and second video signals.

18. The system of claim 17, wherein said comparing means comprises:

means for receiving said calculated expected phase difference from a ratiometric calculator; and means for comparing said calculated expected phase difference to said detected phase difference to produce said error signal.

19. The system of claim 18, wherein said ratiometric calculator comprises a second counter that produces a second ramp signal whose value at any time corresponds to said calculated expected phase difference between the first and second video signals, and wherein said receiving means comprises:

means for sampling said second counter with said pulse of the second video signal, said sample of said second counter representing said calculated expected phase difference.

20. The system of claim 19, wherein said local clock signal generating means comprises:

means for receiving a reference clock signal;

means for filtering said error signal to produce an adjustment signal;

means for using said adjustment signal to adjust a delta value to produce a corrected delta value; and means for dividing the frequency of said reference clock signal by said corrected delta value to generate a line rate adjusted local clock signal.

* * * * *

UNITED STATES PATENT AND TRADEMARK OFFICE
CERTIFICATE OF CORRECTION

PATENT NO.   : 6,385,267 B1
DATED        : May 7, 2002
INVENTOR(S)  : Bowen, Dignam and Naegle It is certified that error appears in the above-identified patent and that said Letters Patent is hereby corrected as shown below:

<u>Column 9,</u>
Line 39, please delete "(TL)" and insert therefor -- ($T_L$) --.
Line 40, please delete "(TE)" and insert therefor -- ($T_E$) --.

Signed and Sealed this

Twenty-ninth Day of October, 2002

Attest:

Attesting Officer

JAMES E. ROGAN
*Director of the United States Patent and Trademark Office*